(12) United States Patent
Reisel et al.

(10) Patent No.: US 8,083,038 B2
(45) Date of Patent: Dec. 27, 2011

(54) SPRING LOADED SPACER

(75) Inventors: Robert Reisel, Morton Grove, IL (US); Ian Conway, Morton Grove, IL (US); Willim Volker, Morton Grove, IL (US)

(73) Assignee: Richco Inc., Morton Grove, IL (US)

( * ) Notice: Subject to any disclaimer, the term of this patent is extended or adjusted under 35 U.S.C. 154(b) by 909 days.

(21) Appl. No.: 11/665,411

(22) PCT Filed: Oct. 6, 2005

(86) PCT No.: PCT/US2005/035965
§ 371 (c)(1),
(2), (4) Date: Apr. 14, 2007

(87) PCT Pub. No.: WO2006/047059
PCT Pub. Date: May 4, 2006

(65) Prior Publication Data
US 2009/0045562 A1    Feb. 19, 2009

(51) Int. Cl.
*F16F 9/32* (2006.01)
(52) U.S. Cl. ............ 188/300; 267/178; 24/453; 24/458; 411/508
(58) Field of Classification Search .................. 188/316, 188/300; 248/638; 267/178, 141, 292; 24/289, 24/295–297, 453, 458; 411/508–510
See application file for complete search history.

(56) References Cited

U.S. PATENT DOCUMENTS

| | | | |
|---|---|---|---|
| 3,777,052 A | 12/1973 | Fegen | |
| 4,430,776 A * | 2/1984 | Shimizu et al. | 24/572.1 |
| 4,495,380 A * | 1/1985 | Ryan et al. | 174/138 D |
| 4,505,458 A | 3/1985 | Schultz | |
| 4,938,703 A * | 7/1990 | Nakano | 439/74 |
| 5,214,569 A * | 5/1993 | Hsiang | 361/748 |
| 5,497,858 A | 3/1996 | Cloud et al. | |
| 5,685,682 A * | 11/1997 | Glime et al. | 411/510 |
| 6,399,888 B1 * | 6/2002 | Chen | 174/138 G |
| 6,773,002 B2 | 8/2004 | Adoline et al. | |
| 7,257,870 B2 * | 8/2007 | Deas et al. | 24/453 |

* cited by examiner

*Primary Examiner* — Pamela Rodriguez
(74) *Attorney, Agent, or Firm* — Martin Faier; James M. Faier; Faier & Faier P.C.

(57) ABSTRACT

A spring loaded spacer for fastening components and control units together with touch control face plates or panels wherein the spacer has a shank portion nested in a barrel portion, one end of the barrel portion being connected to a chassis or the like and its shank portion being connected to one or more printed circuit boards and/or components, and wherein the shank portion is spring loaded within the barrel portion and is adapted to receive one or more printed circuit boards and/or components under tensioned engagement.

8 Claims, 2 Drawing Sheets

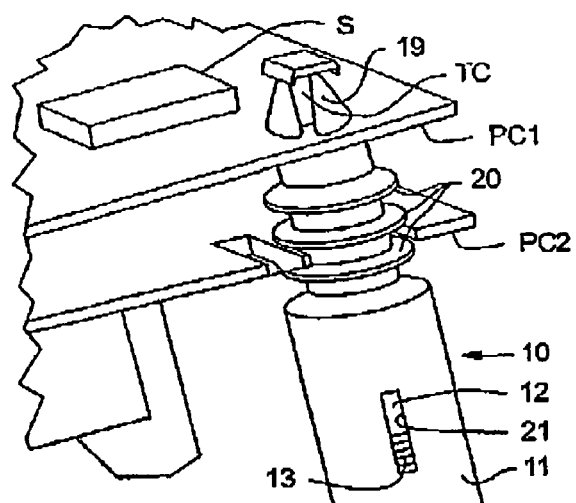
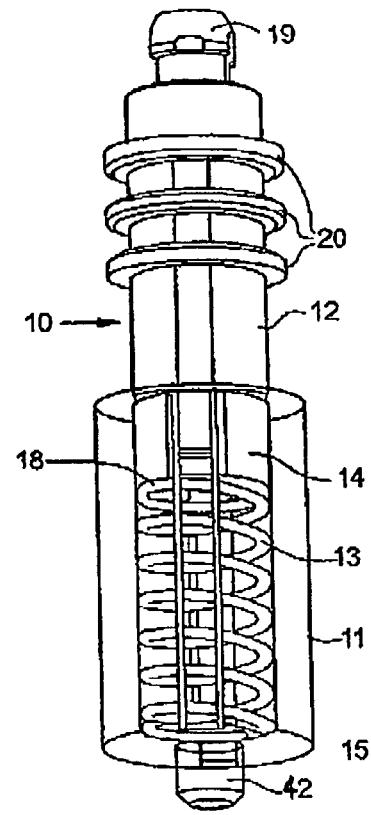
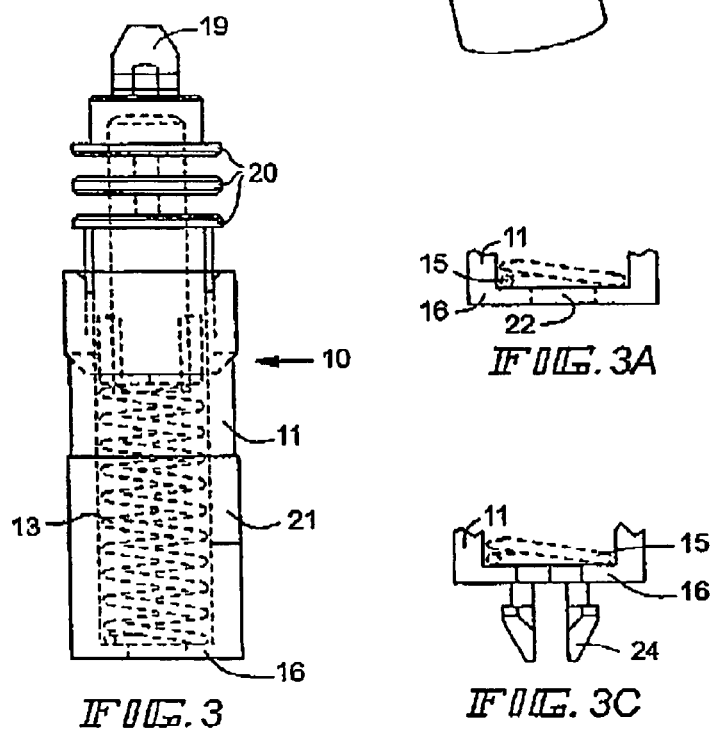

SPRING LOADED SPACER

This invention relates to spring loaded spacers, and is more particularly directed to such products, preferably fabricated from plastic and having insulating qualities, and capable of use in fastening systems for components and control units with touch control face plates or panels.

BACKGROUND AND SUMMARY OF THE INVENTION

Typically, in conventional touch control assemblies, for example, in oven top touch control panels, a separate spring, a separate spacer and often other parts are connected together with a printed circuit board. These assemblies take a significant amount of time and effort to put together. Parts must be properly sized and substantial facility is required for the assembly. The parts and printed circuit board are critical and assembly error can result in damage to the equipment or lessen the life of the appliance in which they are used. Further such parts are not usually interchangeable, and while many fastening systems may be required for a single appliance, separate sub-assemblies are usually required to accomplish the necessary connections.

A fully assembled system is provided by use of the present spring loaded spacer. The spacer is versatile enough to permit modifications such as providing different fix methods for the spring holder, and different spring tensions are available for different sensor pressures. The length of the spring loaded spacer may also be easily varied to accommodate different springs, tensions and required dimensions. Most of all, the novel spring loaded spacer taught by the present invention substantially lessens the time and cost of installation over the cost of providing and assembling traditional components and methods.

By use of a spring loaded spacer embodying the present invention, the head of the device, which may be used to fix it to a printed circuit board with a photolight sensor, can be custom designed to accommodate various hole sizes or other fastening methods. The spacer embodying the present invention has a peripheral ring-like area adjacent its head which can be used to secure a second or other printed circuit board which can hold light and photo sensitive or other components, and may accommodate a variety of board thicknesses; thus, the present spring loaded spacer can securely received several printed circuit boards in spaced apart relation.

A spring loaded spacer embodying the present invention provides uniform and continuous force applied to the printed circuit board or other cover connection, making sure that the components mounted on the board are always in contact with the related part. In such applications, the spring loaded spacer embodying the present inventions acts as a low load shock absorber, and the arrangement of the spring in the part keeps the spring in place and allows for compression as desired.

While the top of the spring loaded spacer embodying the present invention may be removably fixed to a printed circuit board or the like, the bottom of the device is usually connected to and rests upon a chassis or like structure, and may also be used on a clip or a locating pin. The arrangement is sufficiently versatile to permit use of the spacer in almost any environment, i.e. in an electronic device or for automotive or in an appliance or the like. The mounting system for securing the spacer to an underlying surface can be a threaded bolt or a spring washer or a self taping screw or other mounting means, as desired; and such a mounting system can be built into the spring loaded spacer embodying the invention, and fabricated in the same mold.

The device which embodies the present invention consists of a barrel portion having at one end means for connecting it to a chassis or the like and at the other end a shank portion having means for connecting it to a printed circuit board or the like. The shank portion is spring loaded with a coiled compression spring seated within the barrel portion. Arranged on the shank end intended for connection to a printed circuit board or the like are a series of circumferential rings, which may be used to fix one or more printed circuit boards or other components to the spacer. This arrangement permits the barrel portion to have a seat consisting of a snap-in engagement with a chassis or a screw or bolt or other mounting. Likewise the shank end connectable to a printed circuit board or the like may be varied to provide various conventional connections to the printed circuit board or like panel.

OBJECTS AND ADVANTAGES OF THE INVENTION

It is the object of the present invention to provide a spring loaded spacer of the character described.

Another object is to provide a spring loaded spacer for a touch control panel which is fully assembled and ready for installation.

Another object is to provide a spring loaded spacer which can accommodate one or more printed circuit boards or other components.

Another object is to provide a spring loaded spacer which can provide continuous and predetermine pressure to a surface on which it is mounted.

Another object is to provide a spring loaded spacer which can provide continuous and predetermine pressure to a control panel or a photo light sensor secured to a surface on which the spring loaded spacer is mounted.

Another object is to provide a spring loaded spacer which can be easily modified and is adequately versatile to fix it to a printed circuit board or panel or other components.

Another object is to provide a spring loaded spacer which replaces several conventional components and which can be used and installed as a single piece.

Another object is to provide a spring loaded spacer which can be easily modified and adequately versatile to connect it to a chassis or the like by means of a convention snap in, screw, bolt or other conventional fastening means.

It is also the object of the invention to provide a spring loaded spacer which is inexpensive and simple to fabricate and which is easy, effective and efficient to use.

BRIEF DESCRIPTION OF THE DRAWINGS

In the Drawings:

FIG. 1 is a perspective view showing the spring loaded spacer embodying the invention secured on a printed circuit board and having another printed circuit board mounted on its shank (but without its fastening to an underlying chassis).

FIG. 2 is a see-through perspective view of the spring loaded spacer embodying the invention.

FIG. 3 is an elevational view of the spacer shown in FIG. 2, partially in section, with alternative custom connection sections, respectively, marked custom chassis connection sections 3A, 3B, and 3C for the spacer shown in FIG. 2.

Figure 4:
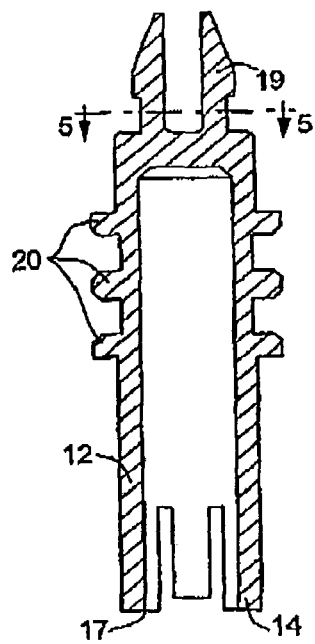
FIG. 4 is a sectional view of the shank for the spacer shown in FIG. 2.
Figure 6:
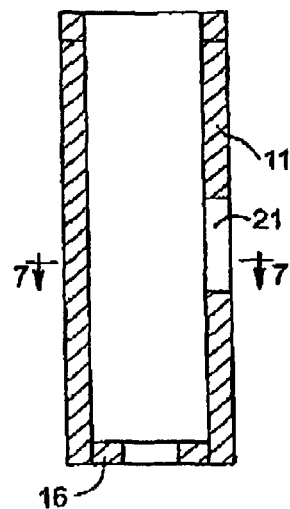
FIG. 6 is a sectional view of the barrel for the spacer shown in FIG. 2.
Figure 8:
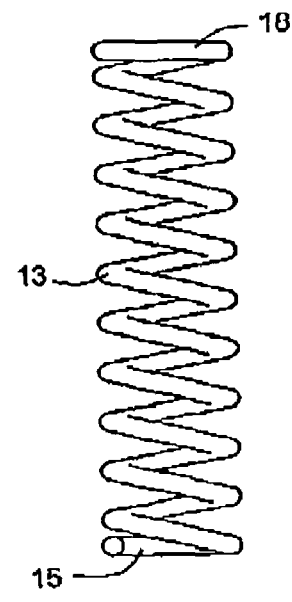
FIG. 8 is an elevational view of the compression spring for the spacer shown in FIG. 2.
Figure 5:
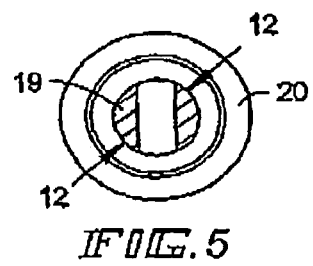
FIG. 5 is a sectional view of the head of the spacer, taken on line 5-5 of FIG. 4.
Figure 7:
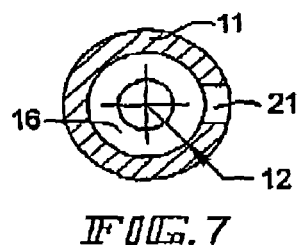
FIG. 7 is a sectional view of the barrel for the spacer, taken on line 7-7 of FIG. 6.

DESCRIPTION OF PREFERRED
EMBODIMENTS

With reference to FIG. 1, a spring loaded spacer 10 is connected to upper printed circuit board PC1 and lower printed circuit board PC2. Components such as a touch control TC and a light sensor S may be secured on the printed circuit board PC1, as shown. Such a spacer 10 is normally installed on a chassis or underlying panel (not shown), and when installed the spacer is biased away from the chassis and toward the printed circuit boards PC1 and PC2.

As shown in FIG. 2, this spring loaded spacer 10 consists of a barrel member 11 having mounting means 42 for connecting the barrel member to an underlying chassis or panel (not shown). The barrel member receives a shank 12 and compression spring 13. The compression spring 13 is installed on a shaft 14 formed on the shank 12 and the spring 13 has a formed end 15 adapted to seat on the bottom 16 of the barrel member 11. Legs 17 are formed in the shank spaced away from the bottom of the shaft 14 to capture the upper end 18 of the spring 13, The end of the shank 12 remote from its shaft 14 carries a fixer member 19 for securing a printed circuit board PC1 or the like to the spring loaded spacer. This fixer member 19 is preferably a barbed arrow head adapted to snap engage in an aperture formed in the printed circuit board. A plurality of circumferential rings 20 may be formed on the shank 12 adjacent the fixer members 19, and these rings 20 may be used to secure one or more additional printed circuit boards PC2 to the spring loaded spacer.

A window 21 may be formed in the barrel 11 for observing action of the shank 12 and spring 13 as the shank is being pressed toward the overlying printed circuit board PC1. The spring pressure applied by the spacer 10 against the printer circuit boards PC1 and/or PC2 may be affected by the compressibility of the spring 13, and greater or lesser spring pressure can be achieved by varying the construction of the spring.

In FIG. 3, three variations of the connecting member for seating the barrel 11 are shown, marked 3A, 3B and 3C. Connecting member in 3A has an aperture 22 at the bottom of the barrel, and a screw or other fastener (not shown) can be used to secure the barrel to a chassis or the like. Connecting member in 3B has a boss 23 which may be threaded or have similar fastening means, as to be able to receive a bolt or screw for securing the barrel to the underlying chassis or panel. Connecting member in 3C may have a barbed arrow 24 which can be used for fastening in a corresponding aperture underlying surface of the chassis or similar panel. These end variations shown in FIG. 3A, 3B or 3C on the bottom of the barrel 11 or on the fixer member 19 on the top of the shaft 12 may be varied in a plastic mold by using a suitable interchangeable cavity when forming the part.

Except for the spring 13, the other parts of the spacer combination, i.e. the barrel 11 and the shaft 12 are preferably fabricated from plastic material, as to have insulating value to inhibit shorting of the printed circuit boards or other electronic or electrical component.

While the invention has been disclosed in considerable detail, it should be understood that many variations may be used in this structure without departing from the spirit or scope of the invention. Accordingly, it is not desired that the invention should be limited to the exact construction described.

The invention claimed is:

1. A spring loaded spacer for fastening an apertured component to and spacing said component apart from a panel, said spacer comprising a barrel portion and a shank portion slidably nested in said barrel portion, said spacer having means for connecting said spacer to said panel, said shank portion being spaced apart from said panel connecting means and removably secured in the aperture of said apertured component, and a compression spring associated with said shank for biasing said apertured component and panel spaced apart under tension, wherein said barrel and shank are fabricated from plastic material having insulating value.

2. In the spacer recited in claim 1, wherein said panel connecting means comprises a boss on said shank for seating said barrel onto said panel without fastener means.

3. In the spacer recited in claim 1, wherein said panel connecting means comprises a barbed member on said barrel for connecting said barrel to said panel.

4. In the spacer recited in claim 1, wherein said spring means is engaged by one end of said shank.

5. In the spacer recited in claim 1, wherein said spacer has means adapted for connection to multiple components.

6. In the spacer recited in claim 5, wherein said multiple component connection means comprises one or more rings on said shank adapted to secure each of said one or more components to said shank.

7. In the spacer recited in claim 6, wherein one of said rings is spaced apart from another of said rings to space the component secured on one of said rings apart from the component secured on another of said rings.

8. In the spacer recited in claim 1, wherein said shank has a shaft for receiving said spring means.

\* \* \* \* \*